(12) United States Patent
Kume

(10) Patent No.: US 6,880,563 B2
(45) Date of Patent: Apr. 19, 2005

(54) APPARATUS AND METHOD OF CLEANING A SUBSTRATE

(75) Inventor: Satoshi Kume, Kanagawa (JP)

(73) Assignee: Semiconductor Leading Edge Technologies, Inc, Kanagawa (JP)

( * ) Notice: Subject to any disclaimer, the term of this patent is extended or adjusted under 35 U.S.C. 154(b) by 304 days.

(21) Appl. No.: 10/050,161

(22) Filed: Jan. 18, 2002

(65) Prior Publication Data

US 2002/0096189 A1 Jul. 25, 2002

(30) Foreign Application Priority Data

Jan. 25, 2001 (JP) ........................................ 2001-016964

(51) Int. Cl.$^7$ ................................................ B08B 3/00
(52) U.S. Cl. .................... 134/184; 134/147; 134/137; 134/148; 134/149; 134/157; 134/902; 366/127
(58) Field of Search ................................ 134/137, 147, 134/184, 149, 157, 148, 902, 1, 1.3; 366/127; 311/335

(56) References Cited

U.S. PATENT DOCUMENTS 4,213,344 A * 7/1980 Rose ............................ 73/620
4,763,677 A * 8/1988 Miller ......................... 134/105
2001/0013355 A1 * 8/2001 Busnaina ..................... 134/1.3
2002/0166569 A1 * 11/2002 Harvey et al. ............... 134/1.3
2003/0045098 A1 * 3/2003 Verhaverbeke et al. ..... 438/689

FOREIGN PATENT DOCUMENTS

| JP | 4-286119 A | 10/1992 |
|---|---|---|
| JP | 5-206095 A | 8/1993 |
| JP | 10-116809 A | 5/1998 |
| JP | 11-145099 A | 5/1999 |

OTHER PUBLICATIONS

Merriam–Webster's Collegiate Dictionary. Tenth edition. 1999. pp. 335, 1292.*

* cited by examiner

*Primary Examiner*—M. Kornakov
(74) *Attorney, Agent, or Firm*—Foley & Lardner LLP

(57) ABSTRACT

A cleaning apparatus is provided with a processing bath to be filled with a cleaning chemical, an ultrasonic oscillator, and a retainer for holding a substrate to be immersed into a cleaning chemical. The front surface of the substrate is cleaned while ultrasonic waves are radiated from the ultrasonic oscillator onto the back surface of the substrate.

5 Claims, 3 Drawing Sheets

APPARATUS AND METHOD OF CLEANING A SUBSTRATE

BACKGROUND OF THE INVENTION

1. Field of the Invention

The present invention relates to a method and apparatus for cleaning a substrate, such as a semiconductor substrate.

2. Background Art

When an interconnection pattern is formed on a semiconductor substrate during the course of manufacture of a semiconductor device, a resist pattern is formed on a metal film; e.g., Al or Cu. The semiconductor substrate is subjected to plasma etching via the resist pattern, thus forming an interconnection pattern.

In association with an increase in the packing density of a device, a sidewall protection film for protecting sidewalls of a pattern during plasma etching is formed thickly, thus improving a geometry into which the metal film is to be etched. In this case, an altered resist layer resulting from plasma etching of a pattern, such as an Al or Cu interconnection, tends to become more difficult to remove during a removal process subsequent to the plasma etching process.

FIG. 7 is a conceptual drawing of a cross section of a pattern for describing the tendency. A resist layer 73 adhering to the side surfaces of an aluminum interconnection pattern 72 on a substrate 71 acts as a sidewall protection film. Concurrently, an altered resist layer 75 adheres also to the sidewalls of a resist pattern 74.

In order to eliminate the resist after etching, the altered resist layer 75 has hitherto been removed by means of a wet etching method. However, there still remain residues of the altered layer that cannot be removed by the solubility of the resist in a chemical.

Alternatively, a single wafer processing cleaner has hitherto been employed. FIG. 8 is a conceptual drawing of an example of such a processing cleaner. In the cleaner, a substrate 82 to be cleaned is placed on top of a rotary stage 81, and chemicals are dropped from a chemical drop nozzle 83 onto the substrate 82. In the case of such a rotary method, structural limitations are imposed on introduction of ultrasonic cleaner for improving the removal.

The present invention has been conceived to solve the drawbacks of the related-art cleaning technology as described above. To this end, there is adopted a dipping method of introducing a chemical into a processing bath. A substrate to be cleaned is immersed in the chemical and exposed to ultrasonic waves, thereby improving a cleaning effect and promoting removal of an altered resist layer adhering to the substrate.

SUMMARY OF THE INVENTION

According to one aspect of the present invention, a substrate cleaning apparatus comprises: a processing bath to be filled with a cleaning chemical, an ultrasonic oscillator disposed in the processing bath and immersed in the cleaning chemical, and a retainer for retaining a substrate to be immersed in the cleaning chemical such that ultrasonic waves originating from the ultrasonic oscillator are radiated onto a back surface of the substrate.

In another aspect, the ultrasonic oscillator has a plurality of oscillation sources disposed in a dispersed manner.

In another aspect, the substrate cleaning apparatus further comprises a rotary mechanism for rotating the substrate retained by the retainer.

In another aspect, the substrate cleaning apparatus further comprises propagation control apparatus for scattering or damping ultrasonic waves originating from the ultrasonic oscillator.

In another aspect, in the substrate cleaning apparatus, the propagation control apparatus is constituted by means of placing, in a propagation path of ultrasonic waves, a plate-like member having a plurality of openings selectively formed therein.

In another aspect, the propagation control apparatus includes jet nozzles for squirting a chemical in the propagation path of ultrasonic waves, thus circulating a flow of chemical.

According to another aspect of the present invention, in a substrate cleaning method, a substrate whose surface has been processed is immersed in a cleaning chemical filled in a processing bath, and ultrasonic waves are radiated onto a back surface of the substrate, thereby cleaning a front surface of the substrate.

Other and further objects, features and advantages of the invention will appear more fully from the following description.

DETAILED DESCRIPTION OF THE PREFERRED EMBODIMENTS

Figure 1:
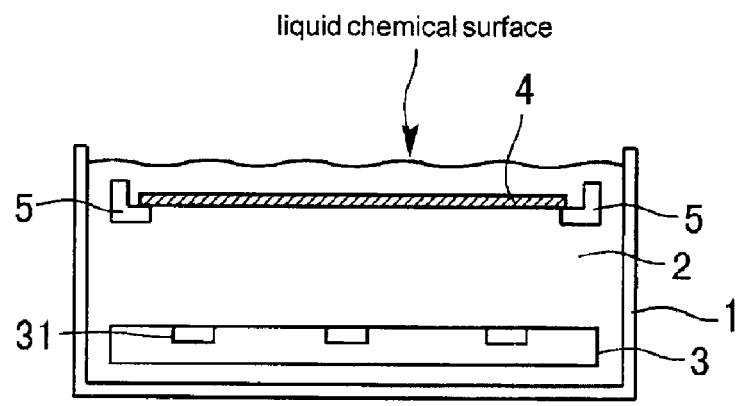
FIG. 1 is a cross-sectional view schematically showing a configuration of a substrate cleaning apparatus according to a first embodiment of the present invention.

Embodiments of the present invention will be described herein below by reference to the accompanying drawings. Throughout the drawings, like or corresponding elements are assigned identical reference numerals, and their repeated explanations are simplified or omitted.

First Embodiment

FIG. 1 is a cross-sectional view schematically showing a configuration of a substrate cleaning apparatus according to a first embodiment of the present invention.

In the cleaning apparatus shown in FIG. 1, a processing bath 1 (or a chemical bath 1) is filled with a cleaning chemical 2. An ultrasonic oscillator 3 is disposed so as to be immersed in the cleaning chemical 2 within the processing bath 1. Preferably, the ultrasonic oscillator 3 is disposed in the vicinity of an interior bottom of the processing bath 1. A retainer 5 for holding a substrate 4 to be cleaned is disposed, preferably, in the vicinity of an interior upper portion of the processing bath 1 such that the substrate 4 is immersed and held in the cleaning chemical 2.

Radiators 31 (or oscillators 31), which serve as radiation sources for emitting ultrasonic waves, are provided on the surface of the ultrasonic oscillator 3. The surface of each of the radiators 31 is oriented toward the substrate 4. The radiators 31 are dispersed at appropriate intervals on the surface of the ultrasonic oscillator 3. The ultrasonic oscillator 3 is constituted by means of housing the ultrasonic radiators 31 into, e.g., a chemical-resistant box.

Figure 2:
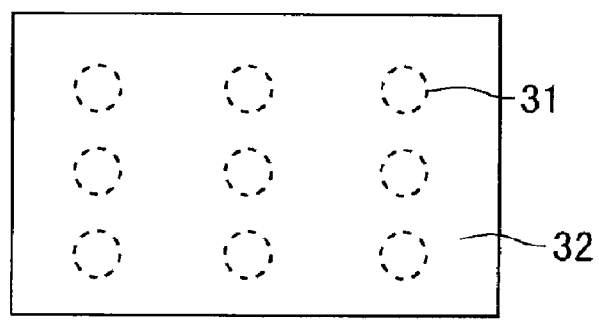
FIG. 2 depicts a preferred example of the ultrasonic oscillator, showing an example layout in which the radiators are arranged on the surface of the ultrasonic oscillator.

FIG. 2 depicts a preferred example of the ultrasonic oscillator 3, showing an example layout in which the radiators 31 are arranged on the surface of the ultrasonic oscillator 3. Each of the radiators 31 has a diameter of, e.g., about 1.5 cm, and the radiators 31 are affixed to a surface plate 32 in a uniformly-dispersed manner at an interval of about 5 cm.

Ultrasonic waves are emitted from the radiators 31 by means of activation of the ultrasonic oscillator 3. The ultrasonic waves propagate through the chemical 2 and are irradiated onto the back surface of the substrate 4. As a result, removal of an altered resist layer adhering to the front surface of the substrate 4 is promoted. For this reason, as shown in FIG. 2, a plurality of radiators 31 are preferably arranged at small intervals in a dispersed manner, thereby improving the consistency of radiated ultrasonic waves within a plane. On the contrary, if one radiator 31 or only a small number of radiators 31 would be provided, an undesirable difference will arise between one area of the substrate 4 located immediately above the radiators 31 and the other area surrounding the one area of the substrate 4, in terms of intensity of ultrasonic waves radiated onto the back surface of the substrate 4.

As has been described above, in the present embodiment, the processing bath 1 filled with a cleaning chemical is provided with the ultrasonic oscillator 3 and the retainer 5 for holding the substrate 4 to be immersed into the cleaning chemical 2 for cleaning purpose. Ultrasonic waves originating from the ultrasonic oscillator 3 are radiated onto the back surface of the substrate 4, thereby cleaning the front surface of the substrate 4.

Use of such a method promotes removal of an altered resist layer or resist residues adhering to the front surface of the substrate 4; for example, an altered resist layer or resist residues resulting from plasma etching of a pattern, such as an Al pattern or a Cu pattern.

Second Embodiment

Figure 3:
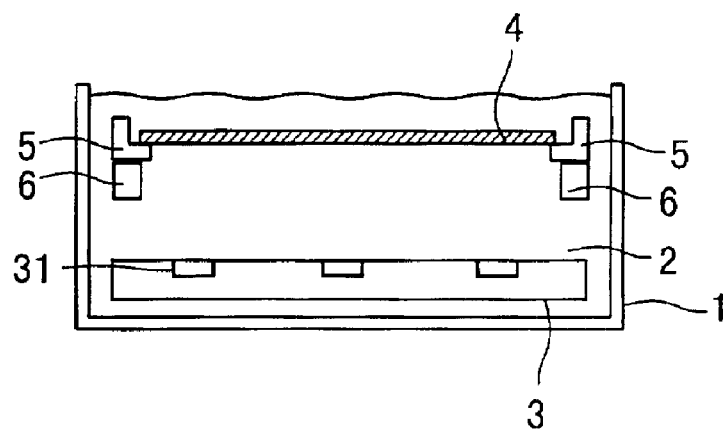
FIG. 3 is a cross-sectional view schematically showing a construction of a substrate cleaning apparatus according to a second embodiment of the present invention.

FIG. 3 is a cross-sectional view schematically showing a construction of a substrate cleaning apparatus according to a second embodiment of the present invention.

In this embodiment, in addition to the structure of a cleaning apparatus shown in FIG. 1, the cleaning apparatus shown in FIG. 3 is further provided with a rotary mechanism 6 for rotating the retainer 5 that holds the substrate 4. For instance, the rotary mechanism 6 rotates the retainer 5 at a constant speed in a circumferential direction while supporting the retainer 5 from below. As a result, the substrate 4 can be rotated in the circumferential direction while remaining within the chemical.

As a result, the surface of the substrate 4 is cleaned with the chemical, thereby improving a cleaning effect. Further, even if inconsistency exists in the intensity profile of ultrasonic waves radiated onto the substrate 4, oscillation exerted within the plane of the substrate 4 can be made consistent by means of rotating the substrate 4. Thus, the effect of ultrasonic waves can be averaged, thereby improving a cleaning effect.

Third Embodiment

Figure 4:
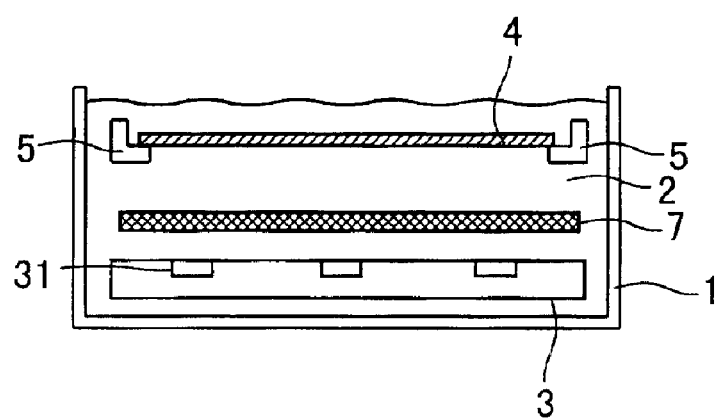
FIG. 4 is a cross-sectional view schematically showing a construction of a substrate cleaning apparatus according to a third embodiment of the present invention.

FIG. 4 is a cross-sectional view schematically showing a construction of a substrate cleaning apparatus according to a third embodiment of the present invention.

In addition to the structure of the cleaning apparatus shown in FIG. 1, the cleaning apparatus shown in FIG. 4 is further provided with a shield plate 7 disposed between the ultrasonic oscillator 3 and the substrate 4 within the processing bath 1; in short, in a path along which ultrasonic waves propagate. The shield plate 7 can scatter or attenuate ultrasonic waves. Specifically, the shield plate 7 is an example of a propagation control member for controlling a propagation characteristic of ultrasonic waves. For example, a member of mesh structure is utilized as the shield plate 7.

As has already been mentioned, utilization of ultrasonic waves for cleaning the substrate 4 promotes removal of an altered resist layer adhering to the substrate 4. There may be a case where there is a necessity of controlling the intensity of ultrasonic waves so as not to impose damage (e.g., exfoliation or corrosion) to Al or Cu, which serves a material of the interconnection, formed on the substrate 4. In this case, there is selected a shield plate 7 having an appropriate shielding effect, and the thus-selected shield plate 7 is disposed, thereby controlling influence of ultrasonic waves.

When the profile of consistency of ultrasonic waves radiated onto the substrate 4 is not necessarily sufficient, a shield plate is interposed between the ultrasonic oscillator 3 and the substrate 4, thereby optimizing the ultrasonic waves through scattering and attenuation.

Figure 5:
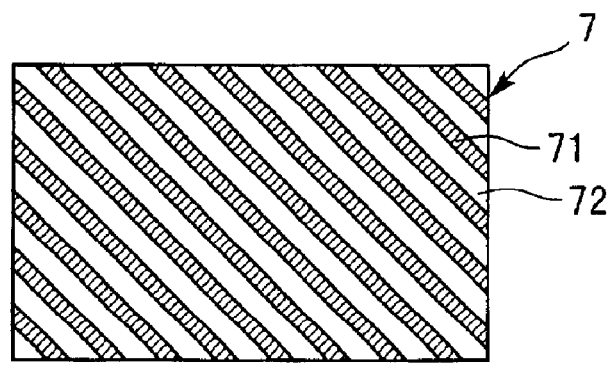
FIG. 5 is a plan view showing a preferred example of the shield plate adapted in the third embodiment.

FIG. 5 is a plan view showing a preferred example of the shield plate 7. The shield plate 7 is formed, by means of forming in a plate member 71 a plurality of slits 72 of appropriate width at predetermined intervals. For instance, a stainless plate or another metal plate possessing chemical resistance can be utilized as the plate member 71. Preferably, a material that does not absorb ultrasonic waves is used. The width of the slit 72 is set to, e.g., 1 to 2 cm. Ultrasonic waves passing through the slits 72 can be controlled by means of adjusting an area ratio of the slits 72 to the shield plate 7. Thus, the intensity of ultrasonic waves propagating through the shield plate 7 can be controlled.

As another example of the shield plate 7, shield plates 7 shown in FIG. 5 are stacked into a double layer, and the positions of the shield plates 7 are displaced from each other through adjustment. As a result, the area ratio of the slits 72 to the stacked shield plates 7 can be variably adjusted.

The shield plate 7 possesses chemical resistance, and is made of material which does not absorb ultrasonic waves. By means of variably changing the area ratio of the slits 72 to the shield plate or plates 7, required action of ultrasonic waves can be selected for each substrate 4.

Fourth Embodiment

Figure 6:
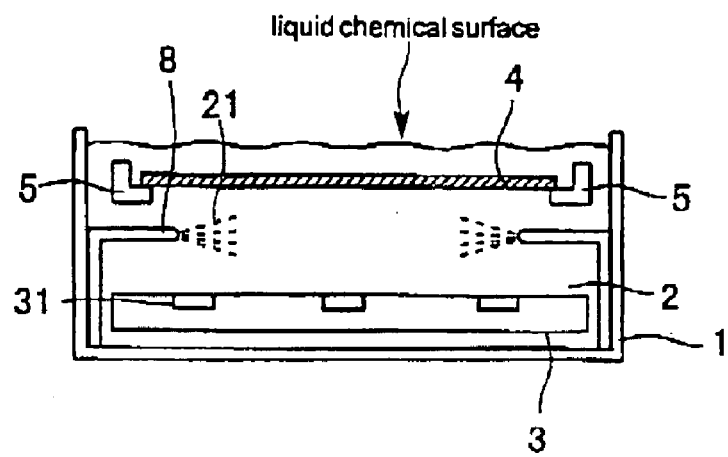
FIG. 6 is a cross-sectional view schematically showing a construction of a substrate cleaning apparatus according to a fourth embodiment of the present invention.
Figure 7:
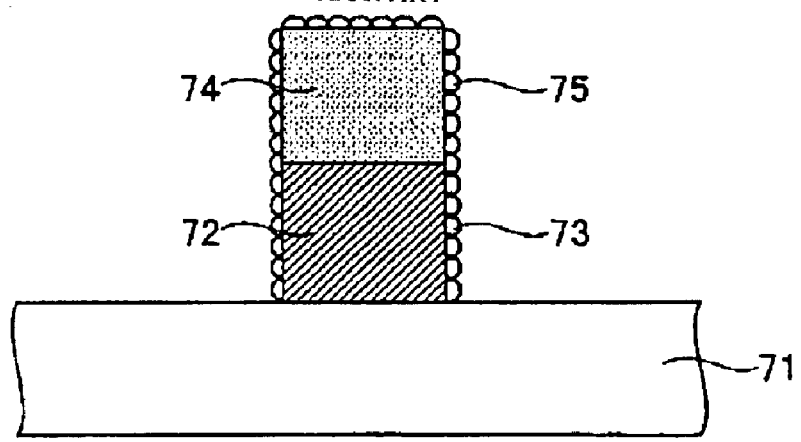
FIG. 7 is a conceptual drawing of a cross section of a pattern for describing an etching process.
Figure 8:
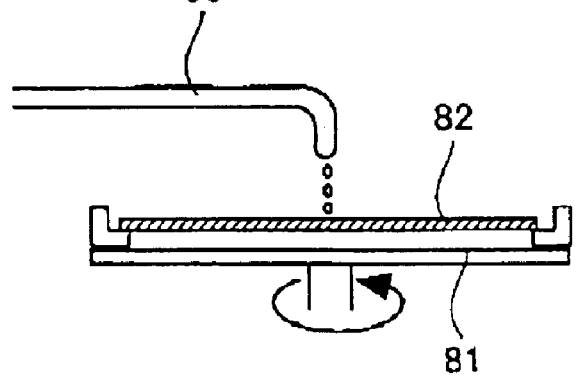
FIG. 8 is a conceptual drawing of an example of a conventional processing cleaner.

FIG. 6 is a cross-sectional view schematically showing a construction of a substrate cleaning apparatus according to a fourth embodiment of the present invention.

In addition to the construction of the cleaning apparatus shown in FIG. 1, the cleaning apparatus shown in FIG. 6 is further provided with jet nozzles 8 disposed between the ultrasonic oscillator 3 and the substrate 4 beside a path along which ultrasonic waves propagate to the substrate 4. The jet nozzles 8 squirt the chemical 2 toward the propagation path of ultrasonic waves. A plurality of jet nozzles 8 are provided in the vicinity of an interior wall of the processing bath 1. The jet nozzles 8 are one example of propagation control members for controlling the propagation characteristic of ultrasonic waves.

Jet flows 21 of the chemical 2 are induced by the jet nozzles 8, thereby stirring or agitating a chemical located in the propagation path of ultrasonic waves, to thereby adjust the flow of chemical within the processing bath 1. As a result, linear radiation of ultrasonic waves is scattered, and the consistency of radiation of ultrasonic waves due to stirring effect can be improved. Further, the stirring effect can contribute to lessening of damage which arises on the surface of the substrate 4.

During manufacture of a semiconductor device, a substrate is cleaned through use of the substrate cleaning method or apparatus described in connection with the previous embodiments, thereby enabling manufacture of a semiconductor device. A cleaning process can be made efficient.

In each of the embodiments, the present invention has been described by means of taking a semiconductor substrate or a semiconductor device as an example. However, the substrate is not limited to a semiconductor substrate; the present invention can be applied to a substrate of another electronic device in the same manner. Products to be manufactured finally are not limited to semiconductor devices and may be other electronic devices.

The features and the advantages of the present invention may be summarized as follows.

Under the substrate cleaning apparatus and method according to the present invention, a substrate is cleaned within a cleaning chemical while being exposed to ultrasonic waves, thus improving an effect of cleaning a substrate.

Under the substrate apparatus and method according to the present invention, a substrate to be cleaned is cleaned while being rotated within a chemical, thus yielding an effect of rendering a cleaning effect uniform within a plane of the substrate.

Under the substrate apparatus and method according to the present invention, the intensity of ultrasonic waves to be radiated onto a substrate to be cleaned is adjusted, or a distribution profile of ultrasonic waves is made uniform. As a result, a cleaning effect achieved within a plane of a substrate to be cleaned can be controlled, and the cleaning effects can be made uniform.

Under the substrate apparatus and method according to the present invention, a substrate is cleaned while being subjected to radiation of ultrasonic waves with a cleaning chemical that is being stirred or agitated. Hence, the consistency of radiation of ultrasonic waves is improved, thereby controlling an effect of cleaning a substrate or rendering the cleaning effect uniform.

It is further understood that the foregoing descriptions are preferred embodiments of the disclosed apparatus and that various changes and modifications may be made in the invention without departing from the spirit and scope thereof.

The entire disclosure of a Japanese Patent Application No. 2001-016964 filed on Jan. 25, 2001 including specification, claims, drawings and summary, on which the Convention priority of the present application is based, are incorporated herein by reference in its entirety.

What is claimed is:

1. A substrate cleaning apparatus comprising:
   a processing bath to be filled with a cleaning chemical;
   an ultrasonic oscillator disposed in the processing bath and immersed in the cleaning chemical; and
   a retainer for retaining a substrate to be immersed in the cleaning chemical such that ultrasonic waves originating from the ultrasonic oscillator are radiated onto a back surface of the substrate; and
   propagation control apparatus for scattering or damping ultrasonic waves originating from the ultrasonic oscillator,
   wherein the ultrasonic oscillator has a plurality of oscillation sources disposed in a uniformly dispersed manner.

2. A substrate cleaning apparatus comprising:
   a processing bath to be filled with a cleaning chemical;
   an ultrasonic oscillator disposed in the processing bath and immersed in the cleaning chemical;
   a retainer for retaining a substrate to be immersed in the cleaning chemical such that ultrasonic waves originating from the ultrasonic oscillator are radiated onto a back surface of the substrate; and
   a rotary mechanism for rotating the substrate retained by the retainer.

3. A substrate cleaning apparatus comprising:
   a processing bath to be filled with a cleaning chemical;
   an ultrasonic oscillator disposed in the processing bath and immersed in the cleaning chemical;
   a retainer for retaining a substrate to be immersed in the cleaning chemical such that ultrasonic waves originating from the ultrasonic oscillator are radiated onto a back surface of the substrate;
   propagation control apparatus for scattering or damping ultrasonic waves originating from the ultrasonic oscillator; and
   a rotary mechanism for rotating the substrate retained by the retainer.

4. The substrate cleaning apparatus according to claim 3, wherein the propagation control means includes jet nozzles for squirting a chemical in the propagation path of ultrasonic waves, thus circulating a flow of chemical.

5. A substrate cleaning apparatus comprising:
   a processing bath to be filled with a cleaning chemical;
   an ultrasonic oscillator disposed in the processing bath and immersed in the cleaning chemical;
   a retainer for retaining a substrate to be immersed in the cleaning chemical such that ultrasonic waves originating from the ultrasonic oscillator are radiated onto a back surface of the substrate; and
   a propagation control apparatus for scattering or damping ultrasonic waves originating from the ultrasonic oscillator, wherein the propagation control apparatus is constituted by means of placing, in a propagation path of ultrasonic waves, a plate-like member having a plurality of openings selectively formed therein.

* * * * *